United States Patent
Jang

(10) Patent No.: US 7,606,103 B2
(45) Date of Patent: Oct. 20, 2009

(54) SEMICONDUCTOR MEMORY DEVICE FOR CONTROLLING RESERVOIR CAPACITOR

(75) Inventor: Chae-Kyu Jang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 46 days.

(21) Appl. No.: 11/528,224

(22) Filed: Sep. 26, 2006

(65) Prior Publication Data

US 2007/0070724 A1    Mar. 29, 2007

(30) Foreign Application Priority Data

Sep. 29, 2005   (KR) ............... 10-2005-0091651
Dec. 6, 2005    (KR) ............... 10-2005-0118142

(51) Int. Cl.
*G11C 5/14*        (2006.01)
(52) U.S. Cl. ............ 365/226; 365/189.09; 365/194; 365/201; 365/189.02
(58) Field of Classification Search ........... 365/226, 365/189.09, 194, 201, 189.02
See application file for complete search history.

(56) References Cited

U.S. PATENT DOCUMENTS

| | | | |
|---|---|---|---|
| 4,549,127 A * | 10/1985 | Taylor et al. ............. | 320/132 |
| 4,888,677 A | 12/1989 | Grimm et al. | |
| 5,051,882 A | 9/1991 | Grimm et al. | |
| 5,689,239 A * | 11/1997 | Turner et al. ............. | 340/10.3 |
| 5,734,291 A * | 3/1998 | Tasdighi et al. ........... | 327/537 |
| 5,886,932 A | 3/1999 | Choi | |
| 5,943,581 A | 8/1999 | Lu et al. | |
| 6,173,651 B1 * | 1/2001 | Pathe et al. .............. | 102/218 |
| 6,218,693 B1 | 4/2001 | Lu | |
| 2002/0097624 A1 * | 7/2002 | Andersen et al. ......... | 365/222 |
| 2003/0151497 A1 * | 8/2003 | Cole et al. .............. | 340/10.34 |
| 2003/0159943 A2 * | 8/2003 | Walters et al. .......... | 205/688 |
| 2004/0095787 A1 * | 5/2004 | Donaldson et al. ...... | 363/50 |

* cited by examiner

*Primary Examiner*—Thong Q Le
(74) *Attorney, Agent, or Firm*—Blakely, Sokoloff, Taylor & Zafman, LLP

(57) ABSTRACT

A semiconductor memory device is provided. Especially, there is disclosed a technique capable of increasing a net die by employing a cell capacitor as a reservoir capacitor according to a set mode. The semiconductor memory device of the present invention uses the cell capacitor as the reservoir capacitor in a normal mode, and prevents each voltage from being applied to the cell capacitor in a burn-in test mode. The voltage applied to the cell capacitor or MOS transistor can be adjusted according to the set mode.

14 Claims, 5 Drawing Sheets

SEMICONDUCTOR MEMORY DEVICE FOR CONTROLLING RESERVOIR CAPACITOR

FIELD OF THE INVENTION

The present invention relates to a semiconductor device, and more particularly, to a reservoir capacitor for use in the semiconductor device.

DESCRIPTION OF RELATED ART

There is a need of driving voltages with various voltage levels in order to drive a semiconductor device. In general, the semiconductor device is provided with an internal voltage generation circuit that receives a power supply voltage and a ground voltage provided from outside and generates a variety of driving voltages as required therein. In other words, the semiconductor device such as a semiconductor memory device includes a plurality of internal voltage generation circuits corresponding to the number of driving voltages required therein. Each internal voltage generation circuit incorporates therein a reservoir capacitor for keeping a voltage level of its driving voltage to be generated.

The reservoir capacitor serves to prevent a level of a driving voltage from fluctuating in order to maintain it to be a constant level when the semiconductor device uses the driving voltage to perform a series of given operations. Since the capacitance of the reservoir capacitor is much greater than that of a general capacitor used for the operation of the semiconductor device, it occupies a large area.

As well-known in the art, a semiconductor memory device is a semiconductor device for storing lots of data in a plurality of unit cells and outputting them therefrom. In a Dynamic Random Access Memory (DRAM) that is the most widely used semiconductor memory device, each unit cell is composed of one capacitor and one MOS transistor. Meanwhile, the semiconductor memory device internally needs a core voltage, a precharge voltage, a cell plate voltage, etc. in order to access data. For keeping these driving voltages, the semiconductor memory device is provided with a reservoir capacitor corresponding to each driving voltage. Also, the semiconductor memory device is equipped with a reservoir capacitor for maintaining a level of a power supply voltage provided from the outside. This reservoir capacitor is mainly formed by using a capacitor induced by a gate electrode film and a gate insulator of MOS transistor.

FIG. 1 shows an example of a reservoir capacitor provided in a conventional semiconductor memory device. Referring to FIG. 1, the existing semiconductor memory device generates a core voltage VCORE and a peripheral voltage VPERI by using an external voltage VEXT inputted from the outside. In order to maintain levels of the generated core voltage VCORE, the peripheral voltage VPERI, and the external voltage VEXT from the outside, a reservoir capacitor 20 is arranged between a power supply supplying a voltage and a ground voltage. Although only one reservoir capacitor is shown for illustration, as described above, it should be noted that each reservoir capacitor is arranged between the power supply and the ground voltage for each driving voltage.

This reservoir capacitor is formed by using a film of a same layer when manufacturing a gate electrode film and a gate insulating film of MOS transistor of unit cell. And, because one of the reservoir capacitor is connected to the power supply while the other is connected to the ground voltage, it always keeps a constant capacitance.

Therefore, in case of changing the capacitance of the reservoir capacitor due to a changed operation environment of the semiconductor memory device, there is no way except redesigning. Accordingly, if the capacitance of the reservoir capacitor required for the semiconductor memory device is changed, its designing and manufacturing should be made again, thereby consuming much developing and manufacturing cost.

In addition, the reservoir capacitor is manufactured by using the gate electrode film and gate insulating film of MOS transistor, and therefore, it needs a large circuit area to maintain a constant capacitance in view of the nature of the gate electrode film and the gate insulating film.

SUMMARY OF THE INVENTION

It is, therefore, a primary object of the present invention to provide a semiconductor memory device capable of controlling a capacitance of a reservoir capacitor.

Another object of the present invention is to provide a semiconductor memory device capable of reducing a circuit size of a reservoir capacitor.

In accordance with the present invention, there is provided a semiconductor memory device including: a power supply unit for receiving and delivering a power supply voltage; a reservoir capacitor for keeping the power supply voltage provided from the power supply unit; and a mode controller for selectively disconnecting the power supply unit from the reservoir capacitor depending on whether a current operation mode is a normal mode or a test mode.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be set forth in detail with reference to the accompanying drawings so that the invention can be readily carried out by those in the art to which the invention pertains.

Figure 1:
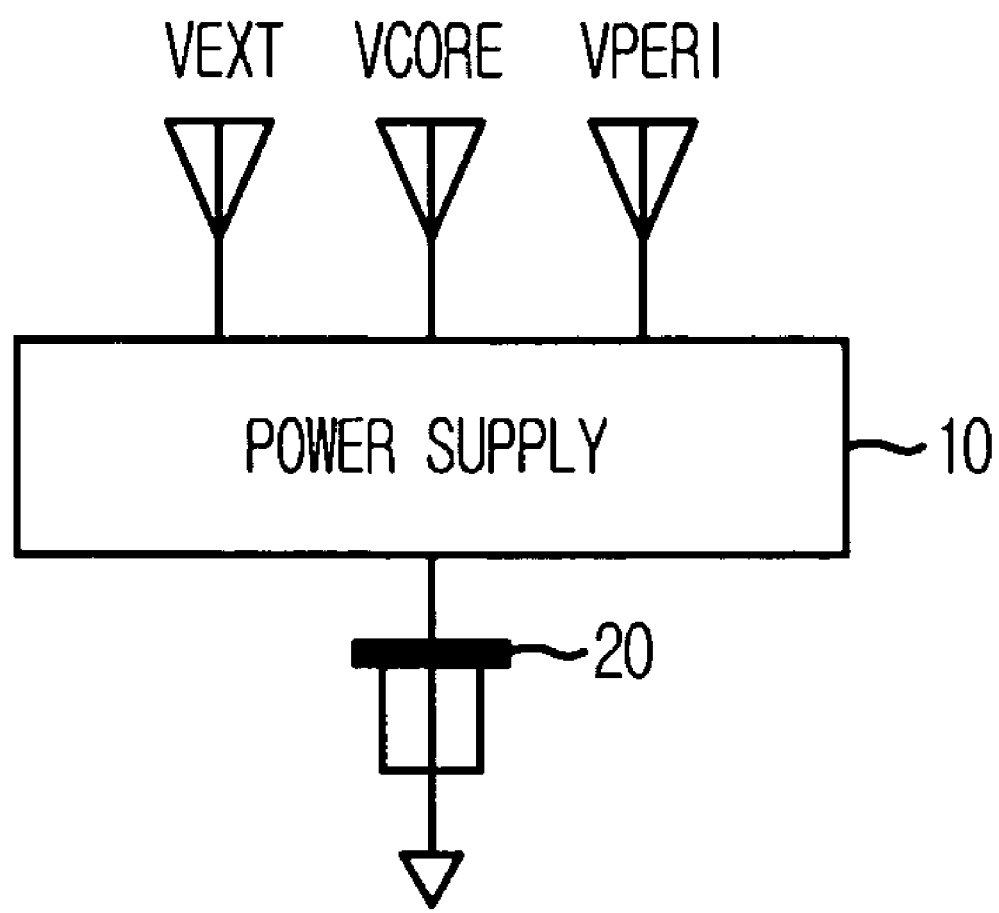
FIG. 1 is a diagram showing a conventional semiconductor device having a reservoir capacitor.
Figure 2:
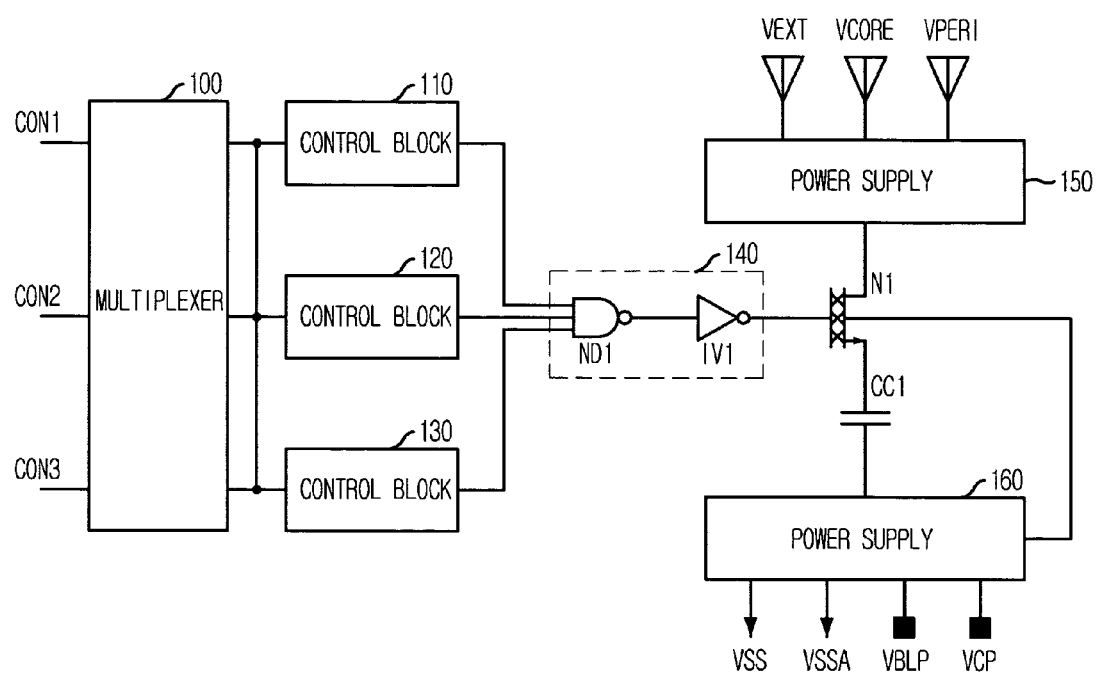
FIG. 2 is a diagram illustrating a semiconductor memory device in accordance with a preferred embodiment of the present invention.

FIG. 2 is a diagram illustrating a semiconductor memory device in accordance with a preferred embodiment of the present invention.

As shown in FIG. 2, the semiconductor memory device includes a multiplexer 100, control blocks 110 to 130, a logic combining circuit 140, power supply s 150 and 160, a MOS transistor N1, and a reservoir capacitor CC1. Although one reservoir capacitor and one MOS transistor are shown for convenience, it should be noted that they are arranged to correspond to the number of input voltages VEXT, VCORE and VPERI respectively, in actually implementing the semiconductor memory device. Alternatively, one reservoir capacitor may be prepared for one driving voltage, and a plurality of reservoir capacitors may be provided for one driving voltage. MOS transistors are prepared as many as the number of reservoir capacitors to be arranged. Further, a variety of voltages (such as VSS, VSSA, VBLP and VCP) as well as the ground voltage may be selectively applied to one terminal of the reservoir capacitor.

The multiplexer 100 selectively outputs control signals CON1 to CON3, and the control blocks 110 to 130 provides mode selection signals to control a mode selection depending on outputs of the multiplexer 100.

The logic combining circuit 140 is composed of a NAND gate ND1 and an inverter IV1 and generates a signal to turn on the MOS transistor N1 through the above components. The NAND gate ND1 NAND-operates the mode selection signals that are the outputs of the control blocks 110 to 130. The inverter IV1 inverters an output of the NAND gate ND1.

The MOS transistor N1, which is illustratively shown in FIG. 2, is connected between the power supply 150 and the reservoir capacitor CC1 and takes an output of the inverter IV1 via its gate.

Figure 3:
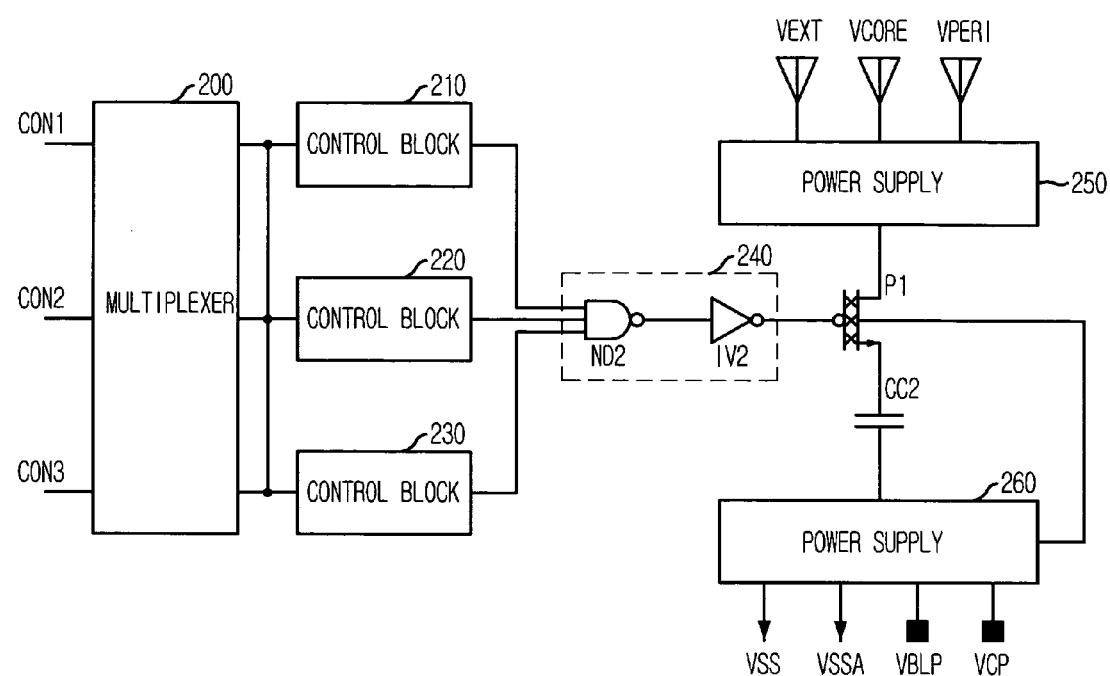
FIGS. 3 to 5 are diagrams illustrating semiconductor memory devices in accordance with other preferred embodiments of the present invention.

FIG. 3 offers a diagram illustrating a semiconductor memory device in accordance with another preferred embodiment of the present invention.

With reference to FIG. 3, a MOS transistor connecting a reservoir capacitor CC2 and a power supply 250 is composed of a PMOS transistor P1. Although one reservoir capacitor and one MOS transistor are shown for convenience, as described above, it should be noted that they are arranged as many as the number of driving voltages such as VEXT, VCORE, VPERI and VDDLL respectively, in actually implementing the semiconductor memory device. Also, one reservoir capacitor may be provided for one driving voltage, and a plurality of reservoir capacitors may be prepared for one driving voltage. The core voltage VCORE is a driving voltage used in cell regions of the semiconductor memory device, the peripheral voltage VPERI is a voltage used in its peripheral region, and the voltage VDDLL is a driving voltage used in a delay locked loop.

If the reservoir capacitors CC1 and CC2 of the present invention having the configuration as above are applied to the semiconductor memory device, they are arranged in the peripheral region. And, each of the reservoir capacitors CC1 and CC2 are formed by using an insulating film and an electrode film used in forming a cell capacitor constituting a unit cell. In general, a breakdown voltage of the cell capacitor is lower than that of a capacitor formed by a gate electrode and a gate insulating film of MOS transistor. Thus, there is no way except that the reservoir capacitor that always accepts a constant voltage level must be formed by using the gate electrode film and gate insulating film of MOS transistor. This is because the reservoir capacitor will break down if a higher voltage is applied thereto in a burn-in test and the like, in case where it is manufactured by a cell capacitor.

However, the present invention is provided with a MOS transistor functioning as a switch at one terminal of the reservoir capacitor, thereby preventing a higher voltage from being applied to the reservoir capacitor even when the higher voltage is to be needed during the burn-in test. Therefore, it is possible to use the cell capacitor of the unit cell as the reservoir capacitor. For example, in a general case where a voltage of about 1.8 V is applied from the outside, the MOS transistors N1 and P1 are turned on and thus the reservoir capacitors CC1 and CC2 are used. On the contrary, in a worst case such as the burn-in test mode, the MOS transistors N1 and P1 are turned off and thus the reservoir capacitors CC1 and CC2 are not used, thereby preventing them from being broken down.

Further, the reservoir capacitors of the semiconductor device in accordance with the present invention can vary voltages (for example, VSS, VSSA, VBLP, and VCP) applied to one terminal thereof accordingly according to a mode selection. These voltages (VSS, VSSA, VBLP, and VCP) are voltages used in driving the semiconductor memory device, and various voltages can be applied to one terminal of the reservoir capacitors. By adjusting levels of voltages applied to one terminal of the reservoir capacitors as such, the capacitances of the reservoir capacitors can be modified. The voltage VSSA is a ground voltage of cell regions, the voltage VBLP is a precharge voltage, and the voltage VCP is a voltage applied to a plate electrode of cell capacitor of unit cell.

Figure 4:
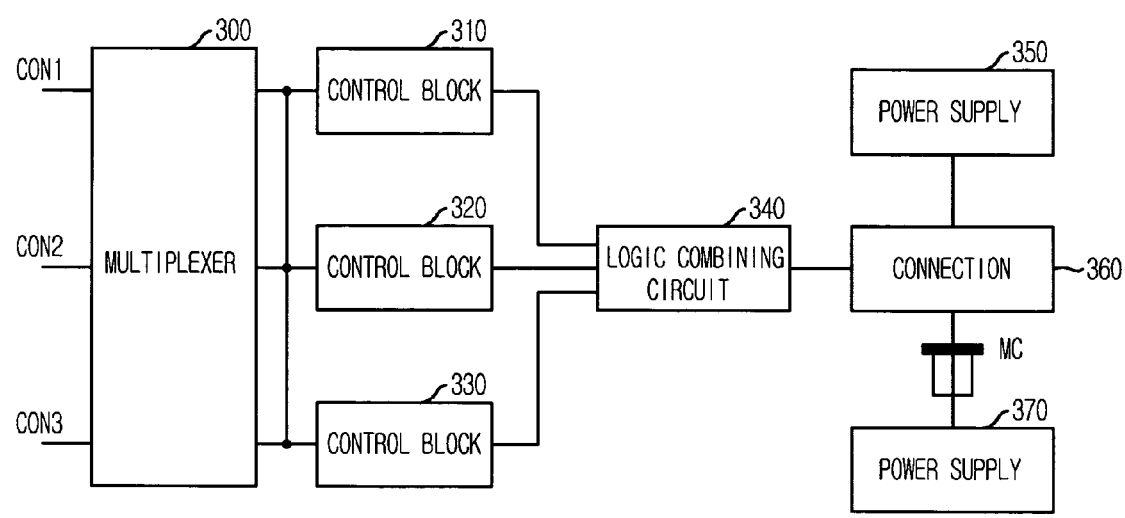

FIG. 4 illustrates a block diagram of a semiconductor memory device in accordance with a second embodiment of the present invention.

The semiconductor memory device shown in FIG. 4 is configured in such a way that a reservoir capacitor MC is formed by using a gate electrode film and gate insulating film of MOS transistor as before. But, a voltage applied to both s of the reservoir capacitor MC can be adjusted by virtue of a multiplexer 300, control blocks 310 to 330, a logic combining circuit 340, power supply s 350 and 370, and a connection portion 360. Here, the connection portion 360 can be embodied by using a MOS transistor, as shown in FIG. 2.

Figure 5:
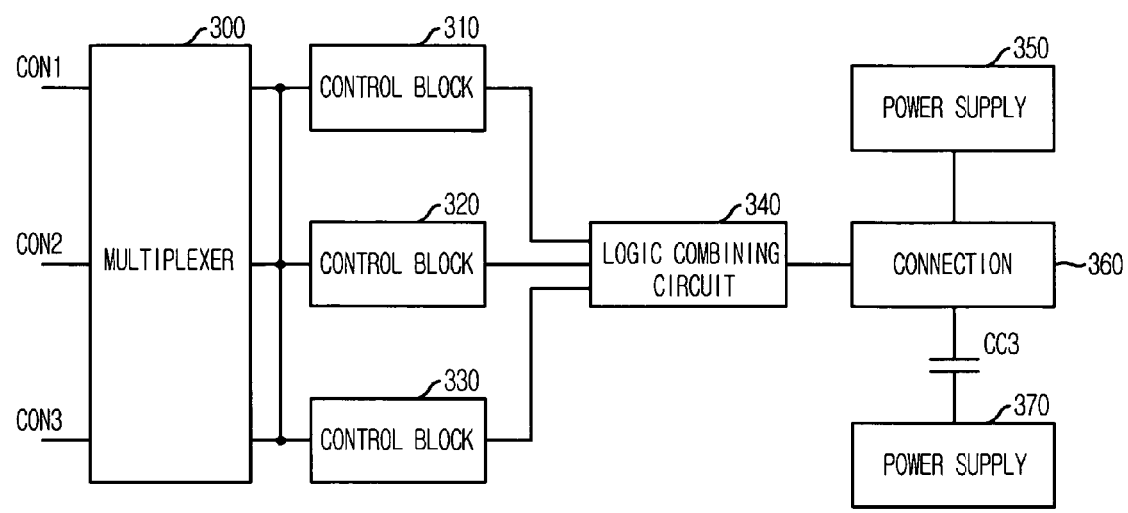

FIG. 5 exemplifies a block diagram of a semiconductor memory device in accordance with a third embodiment of the present invention.

The semiconductor memory device shown in FIG. 5 is characterized by variously adjusting a level of a voltage fed to both s of the reservoir capacitor as required as well as using a cell capacitor of unit cell as the reservoir capacitor. The voltage level fed to the both s of the reservoir capacitor may be one selected from various driving voltages (such as VCORE, VPERI, VEXT, VSS, VSSA, VBLP, and VCP).

In general, a capacitance of the cell capacitor is higher than that of a capacitor using the gate electrode film and gate insulating film of MOS transistor. Accordingly, if the reservoir capacitor is produced by using a cell capacitor, a circuit area thereof can be reduced, compared with the case of manufacturing it by using the gate electrode film and gate insulating film of MOS transistor. In the same area, the capacitance of the cell capacitor is at least 3 times greater than that of a capacitor using the gate electrode film and gate insulating film of MOS transistor. The capacitance of the cell capacitor per unit area is approximately 30 fF, thereby achieving an area security gain of about 4.5 times since a capacitance of MOS transistor is about 6 to 9 fF. Therefore, the circuit area of the semiconductor memory device can be significantly reduced by fabricating the reservoir capacitor with the cell capacitor.

The reservoir capacitor using the cell capacitor is readily broken down due to the difference of external voltages compared with the reservoir capacitor using the gate electrode film and gate insulating film of MOS transistor. For example, if a voltage of 1.8 V is applied from the outside in a normal mode, the core voltage VCORE generally ranges from 1.4 to 1.6 V. Thus, a voltage of about 1.6 V is applied to both s of the cell capacitor of unit cell. But, the core voltage VCORE is set to 2.1 V and tested in the test mode such as the burn-in mode. In this case, a voltage applied to the cell capacitor becomes about 2.1 V, and thus, the reservoir capacitor formed by using the cell capacitor may be broken down. The present invention prevents the reservoir capacitor from being used during the burn-in mode, and therefore, the reservoir capacitor cannot breakdown during the burn-in mode.

As described above, since the present invention provides a reservoir capacitor in a peripheral region of the semiconductor memory device using the cell capacitor of unit cell, it can reduce a circuit area required for the reservoir capacitor.

In addition, the present invention adjusts a level of voltage applied to both s of the reservoir capacitor, and thus, it can control a capacitance of the reservoir capacitor. As a result, the present invention can implement the reservoir capacitor with an optimal capacitance required for the semiconductor memory device.

Moreover, the present invention can more stably use the reservoir capacitor because it prevents a higher voltage from being applied to the reservoir capacitor, in a state that the higher voltage the reservoir capacitor may be broken down is applied.

The present application contains subject matter related to Korean patent application Nos. 2005-91651 and 2005-118142 filed with the Korean Intellectual Property Office on Sep. 29, 2005 and Dec. 06, 2005, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    a power supply unit for receiving and delivering a power supply voltage;
    a reservoir capacitor for storing the power supply voltage provided from the power supply unit; and
    a mode controller for disconnecting the power supply unit from the reservoir capacitor in response to a mode selection signal when a current operation mode is a test mode and connecting the power supply unit to the reservoir capacitor in response to the mode selection signal when the current operation mode is a normal mode,
    wherein the mode selection signal has a different state depending on a combination of a plurality of control signals for mode setting.

2. The semiconductor memory device as recited in claim 1, wherein the mode controller includes a voltage controller for changing a voltage level applied to an electrode film of the reservoir capacitor.

3. The semiconductor memory device as recited in claim 1, wherein the reservoir capacitor is arranged in a peripheral region of the semiconductor memory device.

4. A semiconductor memory device comprising;
    a plurality of reservoir capacitors;
    a first power supply unit, arranged to correspond to the plurality of reservoir capacitors, for controlling a supply of a plurality of first voltages with different levels;
    a mode controller for outputting a mode selection signal having a different state depending on a combination of a plurality of control signals for mode setting; and
    a connection unit for selectively connecting the plurality of first voltages to one terminal of the corresponding reservoir capacitors in response to the mode selection signal, respectively;
    wherein each of the plurality of reservoir capacitors receives the corresponding first voltage through the first power supply unit in a normal mode, and halts receipt of the first voltage under the control of the mode controller in a burn-in test mode.

5. The semiconductor memory device as recited in claim 4, wherein the first power supply unit selectively supplies one of an external power supply voltage, a core voltage, a peripheral voltage, a cell array applying voltage, and a delay locked loop driving voltage.

6. The semiconductor memory device as recited in claim 4, further comprising a second power supply unit for selecting one of a plurality of second voltages with different levels in response to the mode selection signal and supplying the selected one terminal to the other of the plurality of reservoir capacitors, respectively.

7. The semiconductor memory device as recited in claim 6, wherein the second power supply unit selectively supplies one of a ground voltage, a cell array applying voltage, a bit line precharge voltage and a cell plate voltage.

8. The semiconductor memory device as recited in claim 6, wherein the mode controller includes:
    a multiplexer for selectively outputting one of the plurality of control signals;
    a plurality of control blocks for controlling the output of the multiplexer to provide a plurality of mode selection signals; and
    a logic combining unit for logically combining the plurality of mode selection signals.

9. The semiconductor memory device as recited in claim 8, wherein the logical combining unit includes:
    a NAND gate for NAND-operating the plurality of mode selection signals; and
    an inverter for inverting an output of the NAND gate.

10. The semiconductor memory device as recited in claim 4, wherein the connection unit includes a MOS transistor that is arranged between the first power supply unit and the cell capacitor and receives the mode selection signal through a gate terminal.

11. The semiconductor memory device as recited in claim 10, wherein the MOS transistor is an NMOS transistor.

12. The semiconductor memory device as recited in claim 10, wherein the MOS transistor is a PMOS transistor.

13. The semiconductor memory device as recited in claim 10, wherein each of the plurality of reservoir, capacitors is formed by using an electrode film and an insulating film used in a cell capacitor of unit cell arranged in a cell region of the semiconductor memory device.

14. The semiconductor memory device as recited in claim 13, wherein the reservoir capacitor is arranged in a peripheral region of the semiconductor memory device.

* * * * *